(12) United States Patent
Lin et al.

(10) Patent No.: US 7,934,313 B1
(45) Date of Patent: May 3, 2011

(54) PACKAGE STRUCTURE FABRICATION METHOD

(75) Inventors: Pang-Chun Lin, Taichung (TW);
Hsiao-Jen Hung, Taichung (TW);
Chun-Yuan Li, Taichung (TW);
Chien-Ping Huang, Taichung (TW);
Chun-Chi Ke, Taichung Hsien (TW)

(73) Assignee: Siliconware Precision Industries Co., Ltd., Taichung (TW)

( * ) Notice: Subject to any disclaimer, the term of this patent is extended or adjusted under 35 U.S.C. 154(b) by 0 days.

(21) Appl. No.: 12/759,237

(22) Filed: Apr. 13, 2010

(30) Foreign Application Priority Data

Dec. 28, 2009 (TW) .............................. 98145249 A

(51) Int. Cl.
*H05K 3/30* (2006.01)
(52) U.S. Cl. ................. 29/841; 29/832; 29/833; 29/840; 29/852
(58) Field of Classification Search ................... 29/830, 29/832, 833, 840, 841, 852; 174/259; 438/110, 438/111
See application file for complete search history.

(56) References Cited

U.S. PATENT DOCUMENTS

| | | | | |
|---|---|---|---|---|
| 4,635,356 A * | 1/1987 | Ohuchi et al. | ................... | 29/841 |
| 5,087,961 A * | 2/1992 | Long et al. | ..................... | 257/701 |
| 5,273,938 A * | 12/1993 | Lin et al. | ........................ | 438/107 |
| 5,745,984 A * | 5/1998 | Cole et al. | ........................ | 29/834 |
| 5,830,800 A | 11/1998 | Lin | | |
| 5,942,794 A | 8/1999 | Okumura et al. | | |
| 5,976,912 A * | 11/1999 | Fukutomi et al. | ............. | 438/110 |
| 6,001,671 A * | 12/1999 | Fjelstad | ........................ | 438/112 |
| 6,100,594 A * | 8/2000 | Fukui et al. | .................... | 257/777 |
| 6,143,981 A | 11/2000 | Glenn | | |
| 6,201,292 B1 * | 3/2001 | Yagi et al. | ...................... | 257/666 |
| 6,229,200 B1 | 5/2001 | Mclellan et al. | | |
| 6,294,830 B1 * | 9/2001 | Fjelstad | ........................ | 257/724 |
| 6,306,682 B1 | 10/2001 | Huang et al. | | |
| 6,498,099 B1 | 12/2002 | McLellan et al. | | |
| 6,635,957 B2 * | 10/2003 | Kwan et al. | ................... | 257/691 |
| 6,770,959 B2 | 8/2004 | Huang et al. | | |
| 6,821,821 B2 * | 11/2004 | Fjelstad | ........................ | 438/124 |
| 6,872,661 B1 * | 3/2005 | Kwan et al. | ................... | 438/689 |
| 6,884,652 B2 | 4/2005 | Huang et al. | | |
| 6,933,594 B2 * | 8/2005 | McLellan et al. | ............. | 257/676 |
| 6,946,324 B1 * | 9/2005 | McLellan et al. | ............. | 438/111 |
| 6,989,294 B1 * | 1/2006 | McLellan et al. | ............. | 438/111 |
| 6,995,469 B2 * | 2/2006 | Hatakeyama | ................... | 257/738 |
| 7,165,316 B2 * | 1/2007 | Fjelstad | .......................... | 29/620 |
| 7,205,178 B2 * | 4/2007 | Shiu et al. | ..................... | 438/110 |
| 7,214,324 B2 * | 5/2007 | Chilcott | ............................ | 216/2 |

(Continued)

*Primary Examiner* — C. J Arbes
(74) *Attorney, Agent, or Firm* — Peter F. Corless; Steven M. Jensen; Edwards Angell Palmer & Dodge LLP

(57) ABSTRACT

A fabrication method of a package structure includes: preparing a metal plate having first and second surfaces and defined with an active region; forming a wiring layer with conductive traces and first electrical contact pads on the first surface; forming third electrical contact pads corresponding to the first electrical contact pads on the second surface; forming a first encapsulant on the first surface; forming on the second surface an open area to penetrate the metal plate, wherein the metal plate form conductive posts between the first and third electrical contact pads; mounting in the open area a chip electrically connected to the wiring layer; forming a second encapsulant in the open area, the wiring layer and the third electrical contact pads; forming first and second openings in the first and second encapsulants to expose the third electrical contact pads, respectively; and cutting the metal plate to remove the metal layer.

32 Claims, 8 Drawing Sheets

U.S. PATENT DOCUMENTS

| | | | |
|---|---|---|---|
| 7,226,811 B1 * | 6/2007 | McLellan et al. | 438/111 |
| 7,271,032 B1 * | 9/2007 | McLellan et al. | 438/111 |
| 7,439,097 B2 * | 10/2008 | Islam et al. | 438/106 |
| 7,594,316 B2 * | 9/2009 | Noda et al. | 29/830 |
| 2004/0080025 A1 * | 4/2004 | Kasahara et al. | 257/666 |

* cited by examiner

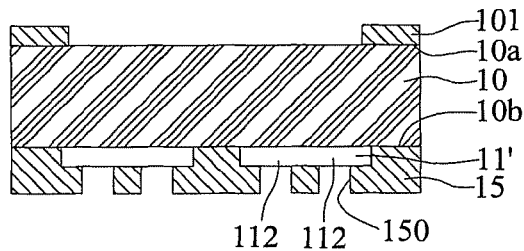
FIG.1A" (PRIOR ART)
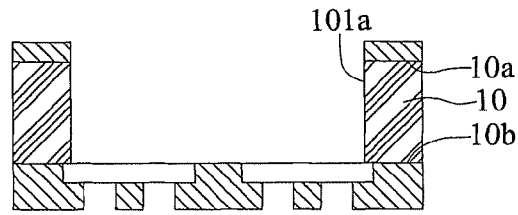
FIG.1B" (PRIOR ART)
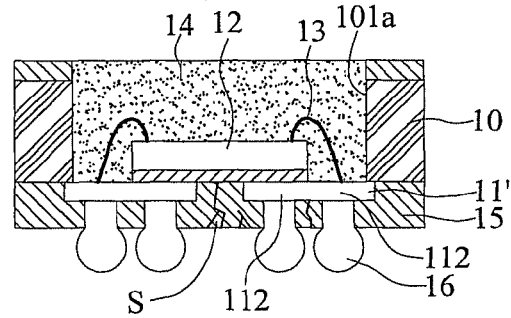
FIG.1C" (PRIOR ART)
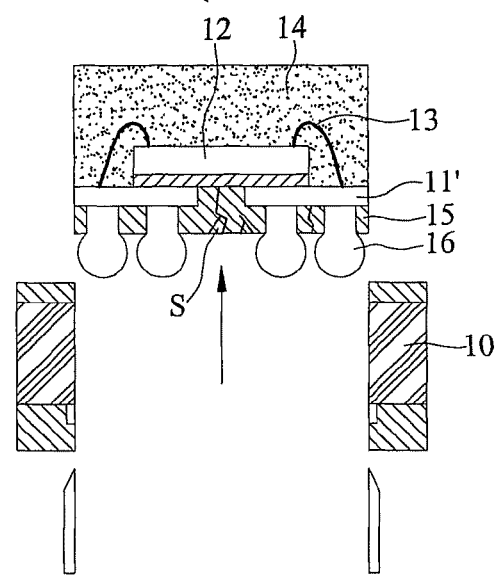
FIG.1D" (PRIOR ART)

PACKAGE STRUCTURE FABRICATION METHOD

CROSS-REFERENCES TO RELATED APPLICATIONS

This application claims under 35 U.S.C. §119(a) the benefit of Taiwanese Application No. 098145249 filed Dec. 28, 2009 the entire contents of which is incorporated herein by reference.

BACKGROUND OF THE INVENTION

1. Field of the Invention

The present invention relates generally to package structure fabrication methods thereof, and more particularly, to a high-quality and low-cost package structure fabrication method.

2. Description of Related Art

In a conventional lead frame based semiconductor package, such as a QFN (Quad Flat Non-lead) package, a semiconductor chip is adhered to a chip carrier, such as a lead frame, and encapsulated by an encapsulant, and leads of the lead frame are exposed from the encapsulant to serve as I/O connections for electrically connecting the semiconductor chip to an external device, such as a printed circuit board, as disclosed by U.S. Pat. No. 5,942,794, No. 6,143,981, No. 6,229,200 and No. 6,498,099.

In addition, carrier-free packages are developed to reduce package size, as disclosed by U.S. Pat. No. 5,830,800 and No. 6,770,959. FIGS. 1A to 1C show a fabrication method of such a carrier-free package. Referring to FIG. 1A, a metal plate 10 made of copper is prepared, and a plurality of electrical contact pads 11 is formed on the metal plate 10 by electroplating. Referring to FIG. 1B, a chip 12 is adhered to the metal plate 10 and electrically connected to the electrical contact pads 11 through bonding wires 13. Then, an encapsulant 14 is formed on the metal plate 10 to cover the chip 12 and the bonding wires 13. Referring to FIG. 1C, the metal plate 10 is removed by etching such that the bottom surfaces of the electrical contact pads 11 are exposed to serve as I/O connections for electrically connecting to an external device.

However, with the metal plate 10 being unfit for routing, lengthy bonding wires are required, thereby increasing the cost and adversely affecting the electrical performance of the package.

Accordingly, U.S. Pat. No. 6,884,652 discloses a carrier-free package that can arrange conductive traces and shorten bonding wires so as to improve the electrical performance of the package. FIGS. 1A' to 1C' show a fabrication method of such a carrier-free package. Referring to FIG. 1A', a metal plate 10 made of copper is prepared, and a dielectric layer 100 is formed on the metal plate 10 to allow a plurality of openings to be formed in the dielectric layer 100 to expose portions of the metal plate 10. Referring to FIG. 1B', a wiring layer 11' is formed on the dielectric layer 100 by such as sputtering. The wiring layer 11' comprises a plurality of conductive traces 111, a plurality of electrical contact pads 112 and bond fingers 113 formed at two ends of the conductive traces 111, respectively. Then, a chip 12 is adhered over the dielectric layer 100 and electrically connected to the bond fingers 113 through bonding wires 13. Then, referring to FIG. 1C', an encapsulant 14 is formed over the dielectric layer 100 to cover the wiring layer 11', the chip 12 and the bonding wires 13, and a singulation process is performed. Thereafter, the metal plate 10 is removed by such as etching to expose the bottom surfaces of the electrical contact pads 112. The exposed bottom surfaces of electrical contact pads 112 serve as I/O connections for electrically connecting to an external device.

However, the above-described technique incurs high costs and requires complicated processes and is not suitable for mass production because of the necessity of forming the dielectric layer 100 on the metal plate 10 and forming the wiring layer 11' by such as sputtering.

Accordingly, a semiconductor package that can arrange conductive traces but dispense with a dielectric layer is proposed by U.S. Pat. No. 6,306,682. FIGS. 1A" to 1D" show a fabrication method of the semiconductor package.

Referring to FIG. 1A", a metal plate 10 made of copper and having a first surface 10a and an opposed second surface 10b is prepared, an electroplated metal layer 101 and an electroplated wiring layer 11' are formed on the first surface 10a and the opposed second surface 10b of the metal plate 10, respectively. The wiring layer 11' comprises a plurality of electrical contact pads 112. A solder mask layer 15 is further formed on the second surface 10b and the wiring layer 11'. A plurality of openings 150 is formed in the solder mask layer 15 to expose the bottom surfaces of the electrical contact pads 112. The exposed bottom surfaces of the electrical contact pads 112 serve as I/O connections for electrically connecting to an external device. Referring to FIG. 1B', the metal plate 10 is etched, from the first surface 10a of the metal plate 10, to form an open area 101a which penetrates the metal plate 10. As shown in FIG. 1C", a chip 12 is received in the open area 101a such that the chip 12 is adhered to the solder mask layer 15 and electrically connected to the electrical contact pads 112 through bonding wires 13. Further, an encapsulant 14 is formed in the open area 101a to encapsulate the chip 12 and the bonding wires 13, and solder balls 16 are formed on the electrical contact pads 112 in the openings 150. Finally, as shown in FIG. 1D", the package is singulated along the periphery of the open area 101a so as to remove the metal plate 10.

However, in the above-described technique, due to the material characteristics of the solder mask layer 15, it is difficult to form an even surface on the solder mask layer 15. As such, when the chip 12 is adhered to the solder mask layer 15, a crack S can easily occur to the solder mask layer 15 (as shown in FIGS. 1C" and 1D"), thus reducing the product yield. Further, since lithography processes such as mask and exposure processes are required for forming the openings 150 in the solder mask layer 15, it incurs high costs and precludes mass production.

Therefore, it is imperative to overcome the above drawbacks of the prior art.

SUMMARY OF THE INVENTION

In view of the above drawbacks of the prior art, the present invention provides a fabrication method of a package structure, comprising the steps of: preparing a metal plate having a first surface and an opposed second surface, and defining at least an active region on the metal plate; forming a wiring layer with a plurality of conductive traces and a plurality of first electrical contact pads on the first surface in the active region; forming a first encapsulant on the first surface of the metal plate to cover the wiring layer; forming on the second surface in the active region an open area penetrating through the metal plate for exposing the wiring layer; disposing a chip in the open area and electrically connecting the chip to the wiring layer; forming a second encapsulant in the open area to cover the chip and the wiring layer; forming a plurality of openings in the first encapsulant to expose the first electrical contact pads, respectively; and removing the metal plate by cutting.

In the above method, the metal plate is made of copper, and the wiring layer is made of at least one selected from the group consisting of gold, palladium, and nickel. The first encapsulant and the second encapsulant are made of a polymer material such as an epoxy resin.

In an embodiment, the openings are formed by laser drilling, and the open area is formed by etching.

In the above method, the process for forming the wiring layer can comprise: forming a resist layer on the first surface of the metal plate; forming a plurality of open areas in the resist layer to expose portions of the first surface of the metal plate; forming the wiring layer in the open areas; and removing the resist layer. Further, the step of forming the wiring layer can comprise forming a metal layer on the first and second surfaces at the periphery of the active region to serve as an anti-etching structure.

In the above method, the chip is flip-chip connected to the wiring layer or electrically connected to the wiring layer through bonding wires electrically connected to a plurality of bond fingers on the wiring layer.

The above method can further comprise forming a plurality of solder balls or conductive bumps on the exposed first electrical contact pads, respectively; and forming a die pad on the first surface in the active region, wherein the wiring layer is located at the periphery of the die pad, and the chip is disposed on the die pad. Further, a portion of the die pad is exposed from at least one of the openings of the first encapsulant to serve as a second electrical contact pad such that a solder ball or conductive bump is disposed thereon.

The present invention further provides a fabrication method of the above-described package structure, comprising the steps of: preparing a metal plate having a first surface and an opposed second surface, and defining at least an active region on the metal plate; forming a wiring layer with a plurality of conductive traces and a plurality of first electrical contact pads on the first surface in the active region, and forming a plurality of third electrical contact pads on the second surface in the active region corresponding in position to the first electrical contact pads; forming a first encapsulant on the first surface of the metal plate to cover the wiring layer; forming on the second surface in the active region an open area penetrating the metal plate for exposing the wiring layer, with the portions of the metal plate remained between the first electrical contact pads and the corresponding third electrical contact pads forming a plurality of conductive posts; disposing a chip in the open area and electrically connecting the chip to the wiring layer; forming a second encapsulant in the open area to cover the chip, the wiring layer and the third electrical contact pads; forming a plurality of first openings in the first encapsulant to expose the first electrical contact pads, respectively; forming a plurality of second openings in the second encapsulant to expose the third electrical contact pads; and removing the metal plate by cutting.

Therein, the step of forming the wiring layer can further comprise forming a metal layer on the first and second surfaces at the periphery of the active region to serve as an anti-etching structure.

According to the present invention, the first encapsulant is formed to cover the wiring layer so as to provide an even surface. As such, when the chip is disposed on the first encapsulant, cracks will not occur to the first encapsulant, thereby preventing the conventional drawbacks caused by the use of a solder mask layer and greatly improving the product quality.

Further, the present invention dispenses with a solder mask layer for covering the wiring layer and accordingly does not require a lithography process for forming openings in a solder mask layer, thus reducing the cost and facilitating mass production.

BRIEF DESCRIPTION OF DRAWINGS

FIGS. 1A' to 1C' are sectional views showing a fabrication method of another conventional package structure;
FIGS. 1A" to 1D" are sectional views showing a fabrication method of another conventional package structure;
FIGS. 2A to 2H are schematic views showing a fabrication method of a package structure according to a first embodiment of the present invention, wherein
FIG. 2B is a sectional view of FIG. 2B', and FIG. 2H' shows another embodiment of the method depicted in FIG. 2H.

DETAILED DESCRIPTION OF PREFERRED EMBODIMENTS

Figure 1A:
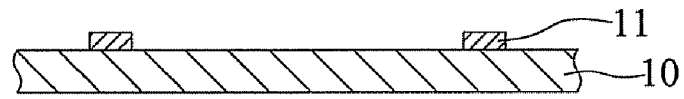
FIGS. 1A to 1C are sectional views showing a fabrication method of a conventional package structure.
Figure 1B:
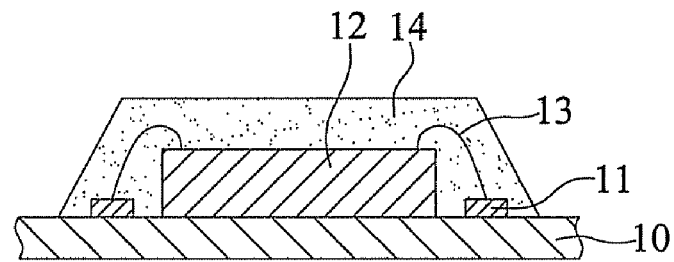
Figure 1C:
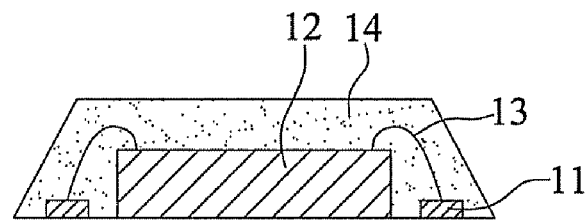
Figure 1A:
Figure 1B:
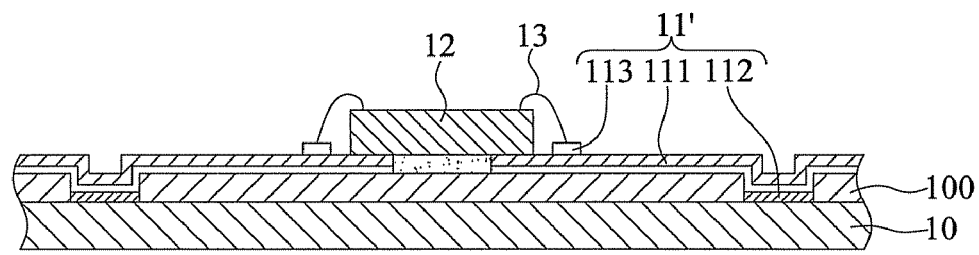
Figure 1C:
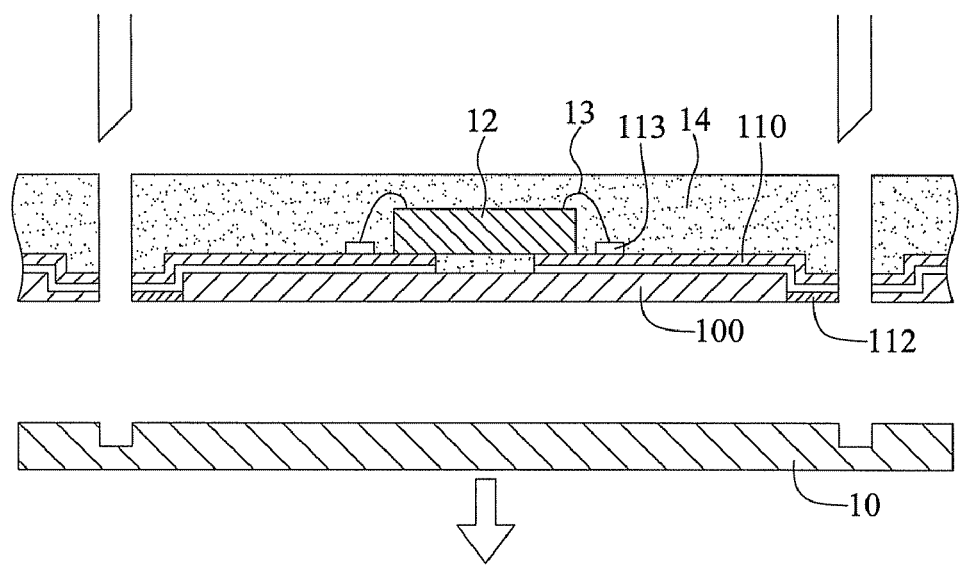

The following illustrative embodiments are provided to illustrate the disclosure of the present invention, these and other advantages and effects can be apparent to those in the art after reading this specification.

First Embodiment

FIGS. 2A to 2H are schematic views showing a fabrication method of a package structure according to a first embodiment of the present invention. For the purpose of brevity, only one package unit is shown in the drawings. But it should be noted that the present invention is not limited thereto. For example, a plurality of package units arranged in array are provided in practice Referring to FIG. 2A, a metal plate 20 having a first surface 20a and an opposed second surface 20b is provided, and at least an active region A is defined on the metal plate 20. Then, a resist layer 200 such as photo resist is formed on the first and second surfaces 20a, 20b, and a plurality of patterned open areas 200a is formed in the resist layer 200 for exposing portions of the first and second surfaces 20a, 20b of the metal plate 20. Further, a patterned metal layer 201 is formed in the open areas 200a by electroplating, wherein the metal layer 201 on the first surface 20a inside the active region A comprises a die pad 210 and a plurality of wiring layers 21. The metal layer 201 on the first and second surfaces 20a, 20b outside the active region A serve as an anti-etching structure 214 in a subsequent etching process.

In the present embodiment, the metal plate 20 is made of copper, and the die pad 210 and the wiring layers 21 are made of at least one selected from the group consisting of gold, palladium, and nickel. The wiring layers 21 each have a plurality of conductive traces 211, a plurality of first electrical contact pads 212 and bond fingers 213 formed at two ends of the conductive traces 211, respectively, wherein the first electrical contact pad 212 serve as ball pads, as shown in FIG. 2B'.

Figure 2A:
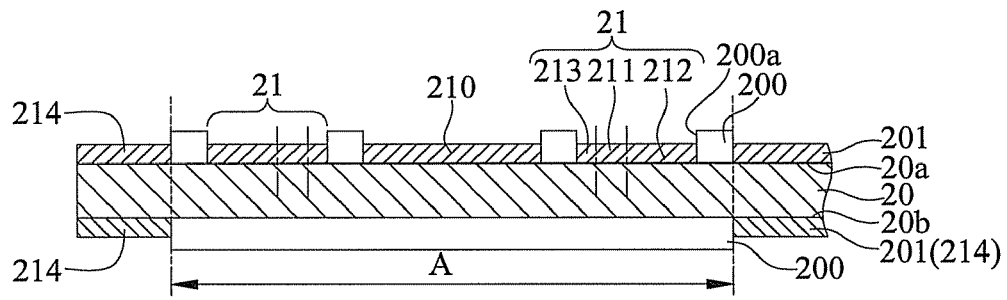
Figure 2B:
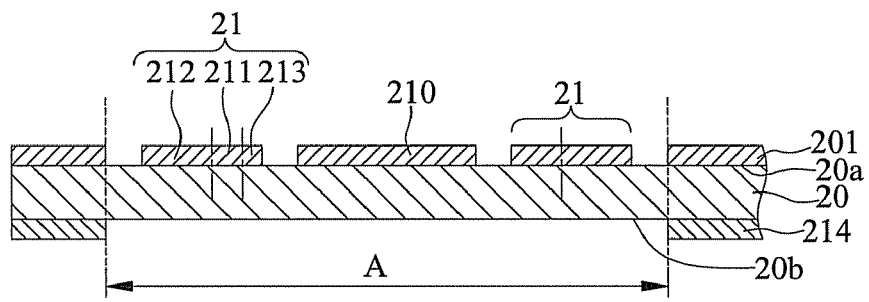
Figure 2B:
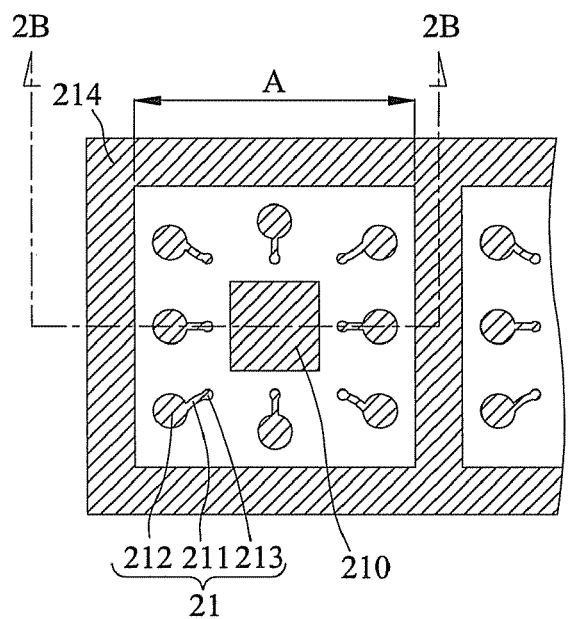

Referring to FIG. 2B, there is shown a sectional view of FIG. 2B', the resist layer 200 is removed to expose portions of the first surface 20a and the second surface 20b in the active region A. Referring to FIG. 2B', the wiring layers 21 are located at the periphery of the die pad 210.

Figure 2C:
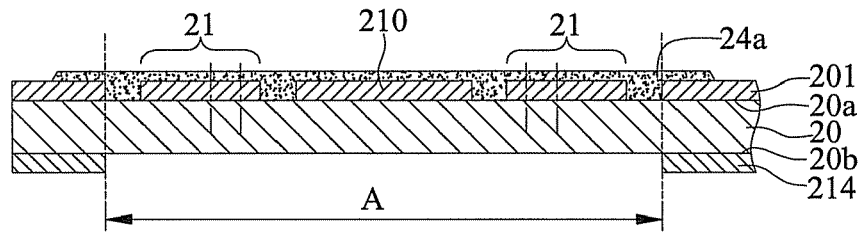

Referring to FIG. 2C, a first encapsulant 24a is formed on the first surface 20a to extend beyond the active region A to cover the die pad 210 and the wiring layers 21, thereby embedding the die pad 210 and the wiring layers 21 in the first encapsulant 24a. The first encapsulant 24a is of a thickness substantially between 0.1 and 0.5 mm, and is made of an epoxy resin polymer material such as EMC (epoxy mold compound), PP (prepeg), ABF (Ajinomoto build-up film) and the like.

Figure 2D:
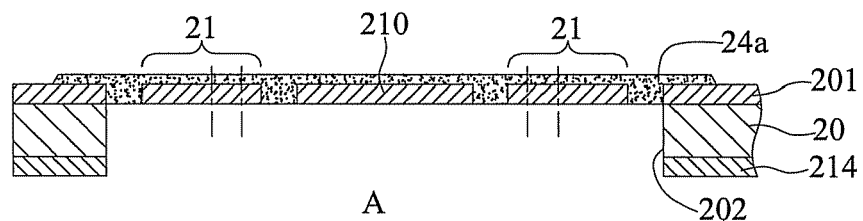

Referring to FIG. 2D, the metal plate 20 is etched from the second surface 20b in the active region A along the edges of the anti-etching structure 214 so as to form an open area 202 penetrating the metal plate 20, and in consequence the die pad 210 and the wiring layers 21 are exposed from the open area 202.

Figure 2E:
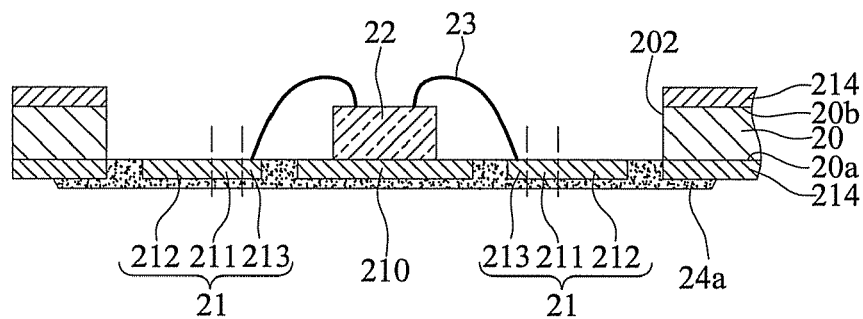

Referring to FIG. 2E, a chip 22 is disposed on the die pad 210 in the open area 202 and electrically connected to the bond fingers 213 of the wiring layers 21 through a plurality of bonding wires 23.

Figure 2F:
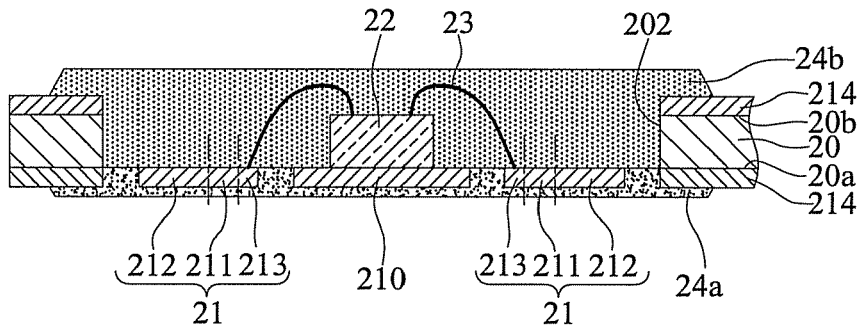

Referring to FIG. 2F, a second encapsulant 24b is formed on the metal plate 20 in the open area 202 to cover the chip 22, the wiring layers 21 and the bonding wires 23 and extend beyond the open area 202. The second encapsulant 24b is made of the same material as the first encapsulant 24a, for example, EMC.

Figure 2G:
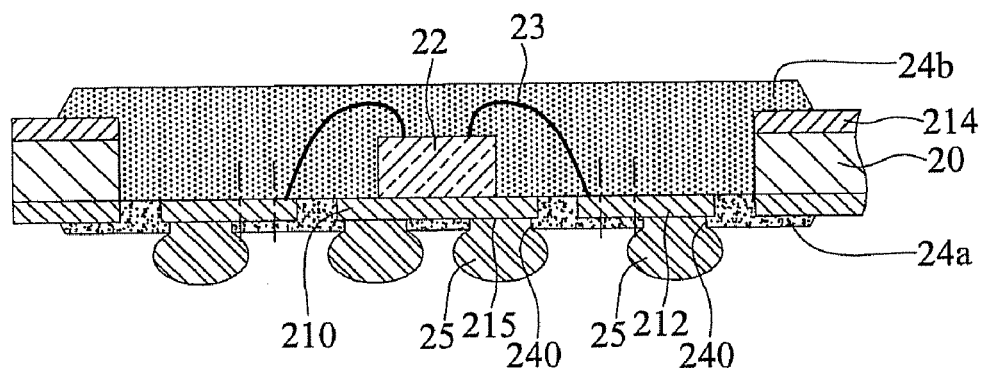

Referring to FIG. 2G, a plurality of openings 240 is formed in the first encapsulant 24a by drilling such that the first electrical contact pads 212 are exposed from the openings 240, wherein the first electrical contact pads 212 are of a width of about 20 μm greater than the diameter of the openings 240. Portions of the die pad 210 are selectively exposed from the openings 240 to serve as second electrical contact pads 215. Conductive elements 25, such as solder balls or conductive bumps, are formed on the first and second electrical contact pads 212, 215 such that a printed circuit board can be mounted on the conductive elements 25.

Figure 2H:
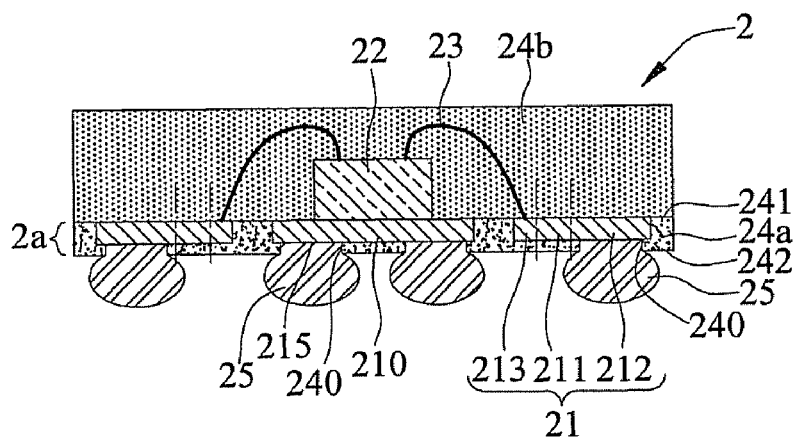
Figure 2H:
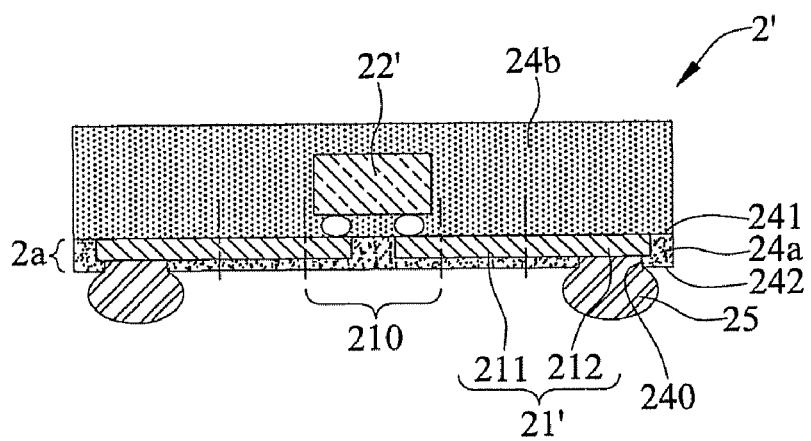

Referring to FIG. 2H, the metal plate 20 is cut and removed so as to form a package structure 2.

In the present embodiment, the first encapsulant 24a is formed to cover the die pad 210 and the wiring layers 21 so as to provide an even surface. As such, when the chip 22 is disposed above the first encapsulant 24a, cracks will not occur to the first encapsulant 24a, thereby preventing the conventional drawbacks caused by the use of a solder mask layer and greatly improving the product quality.

Further, the present invention dispenses with a solder mask layer for covering the die pad 210 and the wiring layers 21 and accordingly does not require a lithography process for forming openings in a solder mask layer, thus reducing the cost and facilitating mass production.

Second Embodiment

FIGS. 3A to 3F are sectional views showing a fabrication method of a package structure according to a second embodiment of the present invention. The second embodiment differs from the first embodiment in that the conductive posts 36 in the second embodiment are formed for facilitating a stacking process.

Figure 3A:
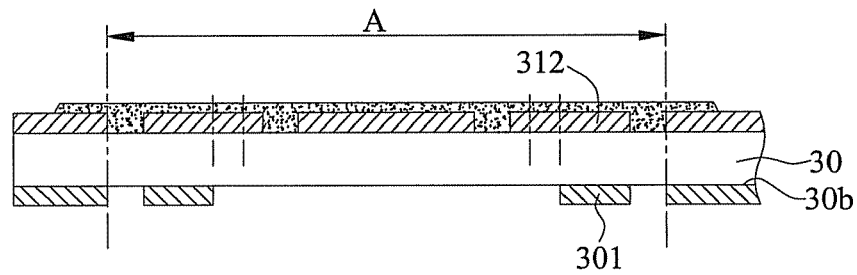
FIGS. 3A to 3F are sectional views showing a fabrication method of a package structure according to a second embodiment of the present invention.

Referring to FIG. 3A, a metal plate 30 with a structure as shown in FIG. 2C is provided, and a plurality of third electrical contact pads 301 corresponding in position to the first electrical contact pads 312 is formed on the second surface 30b in the active region A.

Figure 3B:
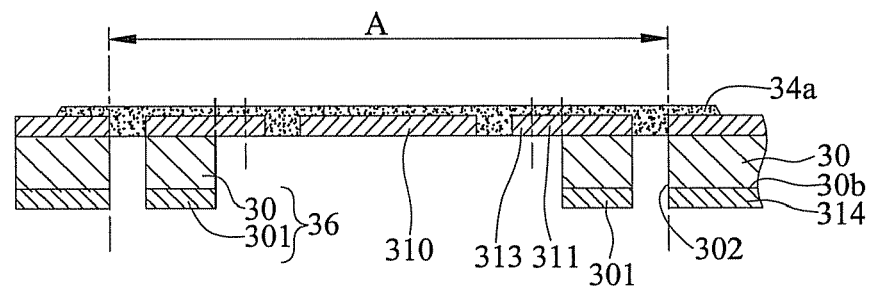

Referring to FIG. 3B, the metal plate 30 is etched from the second surface 30b in the active region A along the inner edges of an anti-etching structure 314 and edges of the third electrical contact pads 301 so as to form an open area 302 to penetrate the metal plate 30, and in consequence the die pad 310, wiring layers 311 and bond fingers 313 are exposed from the open area 302. Therein, the portions of the metal plate 30 located between the first electrical contact pads 312 and the third electrical contact pads 301 corresponding in position thereto are shielded by the third electrical contact pads 301 and thus not etched away during the etching process to thereby form a plurality of conductive posts 36

Figure 3C:
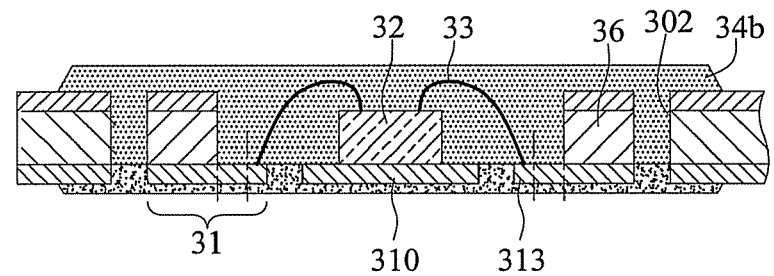

Referring to FIG. 3C, a chip 32 is mounted on the die pad 310 and electrically connected to the bond fingers 313 through a plurality of bonding wires 33; further, a second encapsulant 34b is formed in the open area 302 to cover the chip 32, the conductive posts 36, the wiring layers 31, and the bonding wires 33.

Figure 3D:
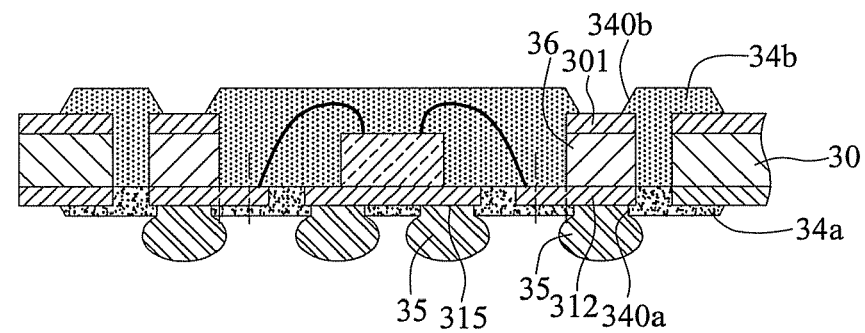

Referring to FIG. 3D, a plurality of first openings 340a is formed in the first encapsulant 34a by laser drilling for exposing the first electrical contact pads 312 and the second electrical contact pads 315. As such, conductive elements 35 can further be formed on the first and second electrical contact pads 312, 315 to allow a printed circuit board to be mounted on the conductive elements 35; meanwhile, a plurality of second openings 340b is formed in the second encapsulant 34b for exposing portions of the third electrical contact pads 301 on the conductive posts 36.

Figure 3E:
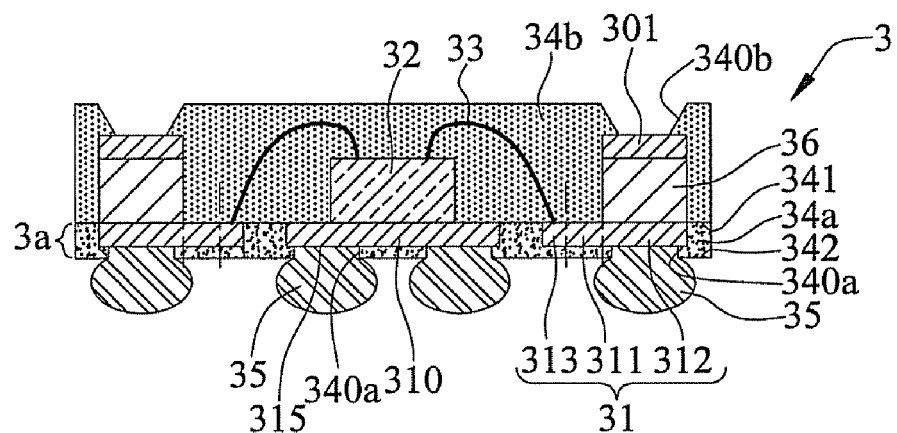

Referring to FIG. 3E, the metal plate 30 is cut and removed to form a package structure 3.

Figure 3F:
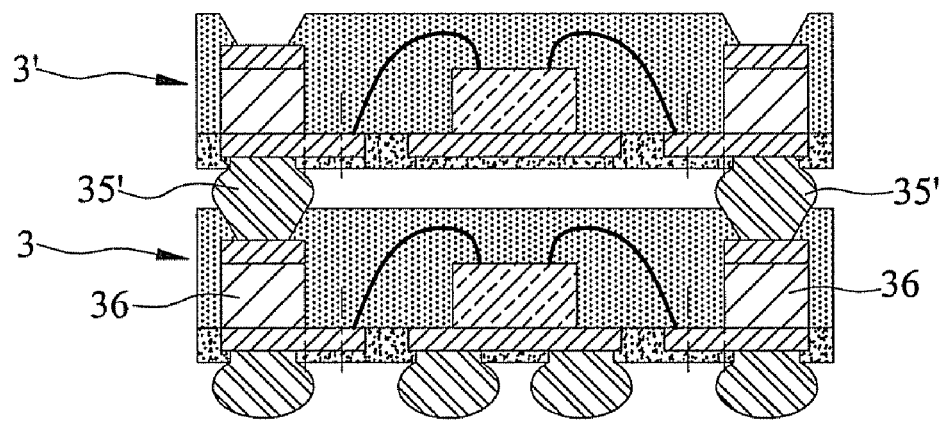

Referring to FIG. 3F, another package structure 3' is stacked on the conductive posts 36 via the conductive elements 35' thereof.

According to the present invention, the first encapsulant is formed to cover the wiring layers so as to provide an even surface thereof. As such, when the chip is disposed on the first encapsulant, cracks will not occur to the first encapsulant, thereby greatly improving the product quality.

Further, the present invention dispenses with a solder mask layer for covering the die pad and the wiring layers and accordingly does not require a lithography process for forming openings in a solder mask layer, thus reducing the cost and facilitating mass production.

The above-described descriptions of the specific embodiments are intended to illustrate the preferred implementation according to the present invention but are not intended to limit the scope of the present invention. Accordingly, all modifications and variations completed by those with ordinary skill in the art should fall within the scope of present invention defined by the appended claims.

What is claimed is:

1. A fabrication method of a package structure, comprising the steps of:

preparing a metal plate having a first surface and an opposed second surface and defined with at least an active region;

forming a wiring layer with a plurality of conductive traces and a plurality of first electrical contact pads on the first surface in the active region;

forming a first encapsulant on the first surface of the metal plate to cover the wiring layer;

forming on the second surface in the active region an open area to penetrate the metal plate for exposing the wiring layer;

disposing a chip in the open area, followed by electrically connecting the chip to the wiring layer;

forming a second encapsulant in the open area to cover the chip and the wiring layer;

forming a plurality of openings in the first encapsulant to expose the first electrical contact pads, respectively; and cutting the metal plate to remove the metal plate.

2. The method of claim 1, wherein the metal plate is made of copper.

3. The method of claim 1, wherein the step of forming the wiring layer comprises the sub-steps of:
 forming a resist layer on the first surface of the metal plate;
 forming a plurality of open areas in the resist layer to expose portions of the first surface of the metal plate;
 forming the wiring layer in the open areas; and
 removing the resist layer.

4. The method of claim 1, wherein the wiring layer is made of at least one selected from the group consisting of gold, palladium, and nickel.

5. The method of claim 1, wherein the first encapsulant is made of one of EMC, PP, and ABF.

6. The method of claim 1, wherein the second encapsulant is made of one of EMC, PP and ABF.

7. The method of claim 1, wherein the open area is formed by etching.

8. The method of claim 1, wherein the step of forming the wiring layer further comprises forming a metal layer on the first and second surfaces at a periphery of the active region to serve as an anti-etching structure.

9. The method of claim 1, wherein the chip is flip-chip connected to the wiring layer.

10. The method of claim 1, wherein the chip is electrically connected to the wiring layer through bonding wires covered with the second encapsulant.

11. The method of claim 10, wherein the wiring layer has a plurality of bond fingers electrically connected to the bonding wires.

12. The method of claim 1, wherein the openings are formed by laser drilling.

13. The method of claim 1, further comprising forming a plurality of solder balls or conductive bumps on the exposed first electrical contact pads, respectively.

14. The method of claim 1, further comprising forming a die pad on the first surface in the active region, the wiring layer being located at a periphery of the die pad, and the chip being mounted on the die pad.

15. The method of claim 14, wherein a portion of the die pad is exposed from at least one of the openings of the first encapsulant to serve as a second electrical contact pad so as for a solder ball or a conductive bump to be formed on the second electrical contact pad.

16. A fabrication method of a package structure, comprising the steps of:
 preparing a metal plate having a first surface and an opposed second surface and defined with at least an active region;
 forming a wiring layer with a plurality of conductive traces and a plurality of first electrical contact pads on the first surface in the active region, followed by forming a plurality of third electrical contact pads corresponding in position to the first electrical contact pads on the second surface in the active region;
 forming a first encapsulant on the first surface of the metal plate to cover the wiring layer;
 forming on the second surface in the active region an open area to penetrate the metal plate for exposing the wiring layer, wherein portions of the metal plate between the first electrical contact pads and the third electrical contact pads form a plurality of conductive posts;
 disposing a chip in the open area, followed by electrically connecting the chip to the wiring layer;
 forming a second encapsulant in the open area to cover the chip, the wiring layer and the third electrical contact pads;
 forming a plurality of first openings in the first encapsulant to expose the first electrical contact pads, respectively;
 forming a plurality of second openings in the second encapsulant to expose the third electrical contact pads; and
 cutting the metal plate to remove the metal layer.

17. The method of claim 16, wherein the metal plate is made of copper.

18. The method of claim 16, wherein the step of forming the wiring layer comprises the sub-steps of:
 forming a resist layer on the first surface of the metal plate;
 forming a plurality of open areas in the resist layer to expose portions of the first surface of the metal plate;
 forming the wiring layer in the open areas; and
 removing the resist layer.

19. The method of claim 16, wherein the first encapsulant is made of one of EMC, PP, and ABF.

20. The method of claim 16, wherein the second encapsulant is made of one of EMC, PP and ABF.

21. The method of claim 16, wherein the wiring layer is made of at least one selected from the group consisting of gold, palladium, and nickel.

22. The method of claim 16, wherein the open area is formed by etching.

23. The method of claim 16, wherein the step of forming the wiring layer further comprises forming a metal layer on the first and second surfaces at a periphery of the active region to serve as an anti-etching structure.

24. The method of claim 16, wherein the chip is flip-chip connected to the wiring layer.

25. The method of claim 16, wherein the chip is electrically connected to the wiring layer through bonding wires covered with the second encapsulant.

26. The method of claim 25, wherein the wiring layer has a plurality of bond fingers electrically connected to the bonding wires.

27. The method of claim 16, wherein the first openings are formed by laser drilling.

28. The method of claim 16, further comprising forming a plurality of solder balls or conductive bumps on the first electrical contact pads exposed from the first openings, respectively.

29. The method of claim 16, further comprising forming a die pad on the first surface in the active region, the wiring layer being located at a periphery of the die pad, and the chip being mounted on the die pad.

30. The method of claim 29, wherein a portion of the die pad is exposed from at least one of the openings of the first encapsulant to serve as a second electrical contact pad so as for a solder ball or a conductive bump to be formed on the second electrical contact pad.

31. The method of claim 16, wherein the conductive posts are made of copper.

32. The method of claim 16, wherein the third electrical contact pads are made of at least one selected from the group consisting of gold, palladium, and nickel.

* * * * *